United States Patent
Lin et al.

(10) Patent No.: US 8,143,778 B2
(45) Date of Patent: Mar. 27, 2012

(54) ORGANIC-INORGANIC LIGHTING DEVICE AND A METHOD FOR FABRICATING THE SAME

(75) Inventors: Ching-Fuh Lin, Taipei (TW); Chun-Yu Lee, Taipei (TW)

(73) Assignee: National Taiwan University, Taipei (TW)

( * ) Notice: Subject to any disclaimer, the term of this patent is extended or adjusted under 35 U.S.C. 154(b) by 505 days.

(21) Appl. No.: 12/453,402

(22) Filed: May 11, 2009

(65) Prior Publication Data

US 2010/0283387 A1 Nov. 11, 2010

(51) Int. Cl.
*H01L 51/50* (2006.01)

(52) U.S. Cl. ........... 313/503; 313/504; 427/66; 428/690

(58) Field of Classification Search .................. 313/503, 313/504; 427/66; 428/690
See application file for complete search history.

(56) References Cited

U.S. PATENT DOCUMENTS

| | | | | |
|---|---|---|---|---|
| 5,783,292 | A * | 7/1998 | Tokito et al. | 428/212 |
| 6,777,871 | B2 * | 8/2004 | Duggal et al. | 313/506 |
| 7,265,392 | B2 * | 9/2007 | Hahn et al. | 257/99 |
| 7,691,666 | B2 * | 4/2010 | Levy et al. | 438/104 |
| 2005/0009224 | A1 * | 1/2005 | Yang et al. | 438/57 |
| 2006/0043361 | A1 * | 3/2006 | Lee et al. | 257/40 |
| 2006/0063029 | A1 * | 3/2006 | Jang et al. | 428/690 |
| 2007/0034857 | A1 * | 2/2007 | Song | 257/13 |
| 2007/0158661 | A1 * | 7/2007 | Lu et al. | 257/79 |
| 2008/0251780 | A1 * | 10/2008 | Li et al. | 257/13 |
| 2010/0133527 | A1 * | 6/2010 | Lin et al. | 257/43 |
| 2011/0012505 | A1 * | 1/2011 | Lin et al. | 313/504 |

* cited by examiner

*Primary Examiner* — Nimeshkumar Patel
*Assistant Examiner* — Mary Ellen Bowman
(74) *Attorney, Agent, or Firm* — Rosenberg, Klein & Lee

(57) ABSTRACT

An organic-inorganic lighting device and a method for fabricating the same is disclosed. Firstly, a conductive substrate is provided, and an inorganic conducting film layer and a seed layer are formed in turn on the conductive substrate. Next, an array of micro and nano zinc oxide wire is formed on the seed layer by using properties of the seed layer. Finally, an electrode layer is formed on the array of micro and nano zinc oxide wire. The invention solves the problem of low mobility of electrons in inorganic materials.

20 Claims, 16 Drawing Sheets

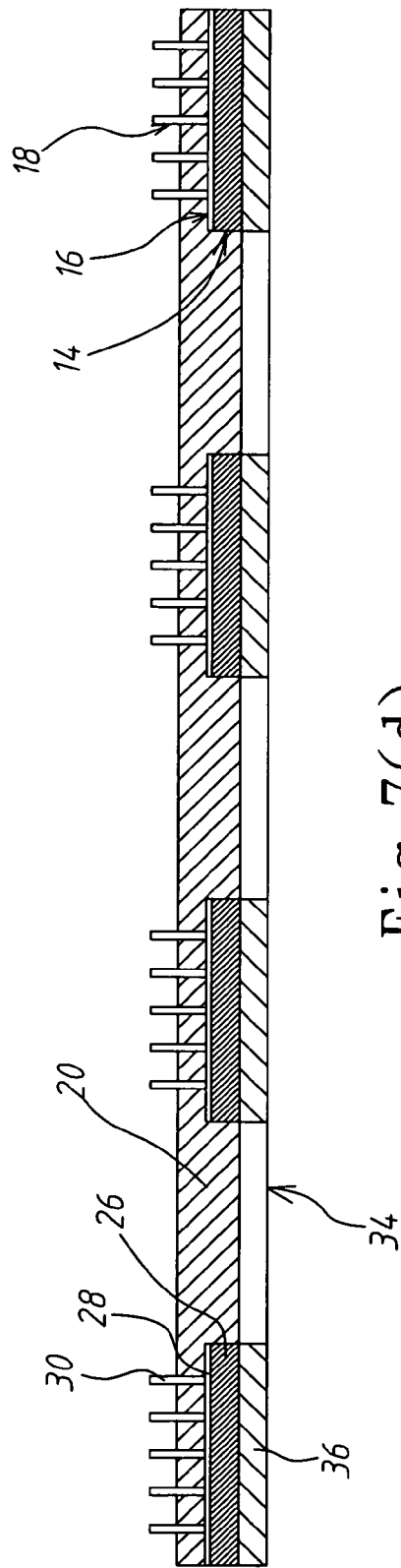
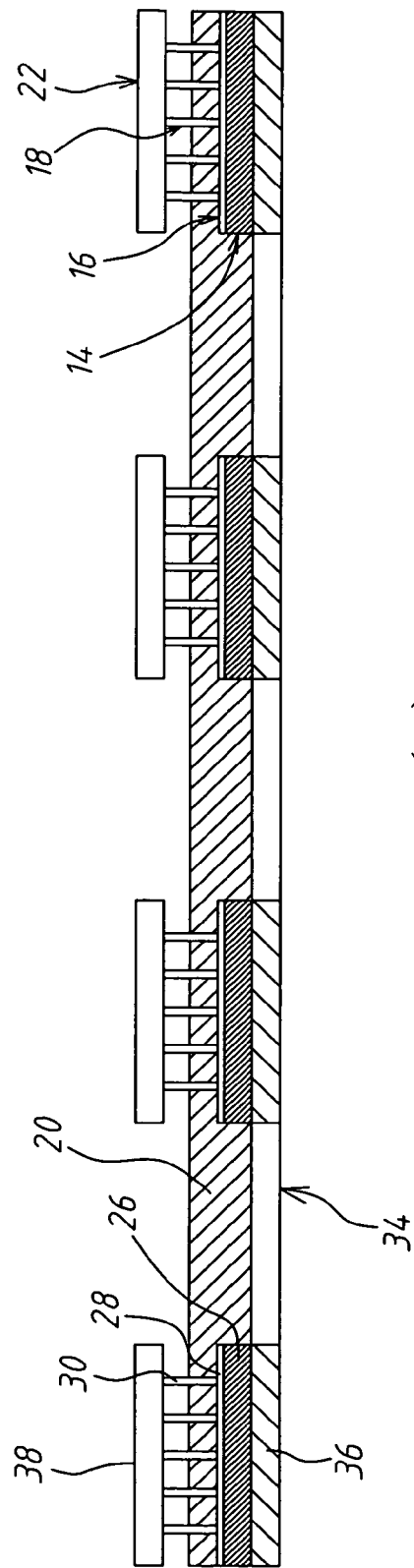
Fig. 7(d)
Fig. 7(e)

ORGANIC-INORGANIC LIGHTING DEVICE AND A METHOD FOR FABRICATING THE SAME

BACKGROUND OF THE INVENTION

1. Field of the Invention

The present invention relates to a lighting technology, particularly to an organic-inorganic lighting device and a method for fabricating the same.

2. Description of the Related Art

Since the LED was commercialized in 1960, LEDs have been used in many different devices, such as household appliances, indicators, or lighting sources for many kinds of instruments. This is because an LED has the following advantages: a high shake-enduring property, long life, lower power consumption, and a low heat-generating level. Because various colored and high intensity LEDs are now available, LEDs are now being utilized in outdoor displays, such as large-scale outdoor billboards, and traffic lights. Three primary colors of the visible light spectrum are red, yellow and blue. High intensity blue-light LEDs and green-light LEDs are essential for a full-color outdoor billboard.

An OLED (Organic Light Emitting Diode) display plays an important role in the advancing development of panel displays. As implied by the name OLED, OLEDs are used as a lighting source in an OLED display and the materials that the OLED requires are divided into two types. One type is macromolecular and the other type is micromolecular. An OLED has the following advantages conformed to the needs of displays in the multimedia era: no limit to the visible angle, low fabrication cost, high response speed (more than one hundred times the speed of a liquid crystal), electricity saving properties, DC driving used with portable machines, light weight, and miniaturization and thinning as the size changes for hardware. Therefore, an organic electro luminescent device has a very strong development potential in panel display systems and an OLED display is expected to become a novel panel display in the near future.

However, in the development of the OLED most organic materials are advantageous to the transmission of electrons but disadvantageous to the transmission of holes. Therefore, this phenomenon can easily cause the number of electrons and holes in a device to be unbalanced and the efficiency of the device is affected. On the contrary, inorganic materials of an inorganic diode are advantageous to the transmission of holes but disadvantageous to the transmission of electrons. Additionally, in the general development of an inorganic lighting diode, the developer must consider the complicated and expensive epitaxial equipment and the process temperature of the epitaxial equipment which is more than 300° C. Therefore, the fabrication cost of an inorganic diode is very high. For example, in the technology of the prior art, forming a zinc oxide thin-film on an organic layer made of MEHPPV [poly (2-methoxy-5-(2'-ethyl-hexyloxy)-1,4-phenylene vinylene) is fabricated by an electron beam evaporation method with high fabrication cost.

In view of the problems and shortcomings of the prior art, the present invention provides an organic-inorganic lighting device and a method for fabricating the same, so as to solve the afore-mentioned problems of the prior art.

SUMMARY OF THE INVENTION

An objective of the present invention is to provide an organic-inorganic lighting device and a method for fabricating the same, whereby a P-type organic conductive thin-film layer fabricated by a spin-coating method is combined with an N-type array of micro and nano zinc oxide wire of inorganic materials fabricated by a hydrothermal method. As a result, the difficult problems of low electron mobility in organic materials and epitaxial process of an inorganic diode in a vacuum and high-temperature environment with expensive equipment are solved, and the fabrication cost is greatly reduced.

To achieve the abovementioned objectives, the present invention provides an organic-inorganic lighting device, which comprises a conductive substrate; a P-type organic conductive thin-film layer formed on the conductive substrate; a seed layer formed on the P-type organic conductive thin-film layer; an N-type array of micro and nano zinc oxide wire formed on the seed layer; and an electrode layer formed on the array of micro and nano zinc oxide wire.

The present invention also provides a method for fabricating an organic-inorganic lighting device which comprises the following steps: providing a conductive substrate and sequentially forming a P-type organic conductive thin-film layer, a seed layer and an N-type array of micro and nano zinc oxide wire on the conductive substrate, wherein the organic conductive thin-film layer and the array of micro and nano zinc oxide wire are respectively fabricated by a spin-coating method and a hydrothermal method; and forming an electrode layer on the array of micro and nano zinc oxide wire.

Below, the embodiments are described in detail in cooperation with the drawings to make easily understood the technical contents, characteristics and efficacies of the present invention.

BRIEF DESCRIPTION OF THE DRAWINGS

FIGS. 7(a)-7(e) are sectional views showing a method for fabricating the organic-inorganic lighting device according to the third embodiment of the present invention;

DETAILED DESCRIPTION OF THE INVENTION

In order to solve the problem of the electron transmission in organic materials and the fabrication cost of inorganic materials, the present invention provides an organic-inorganic lighting device.

Figure 1:
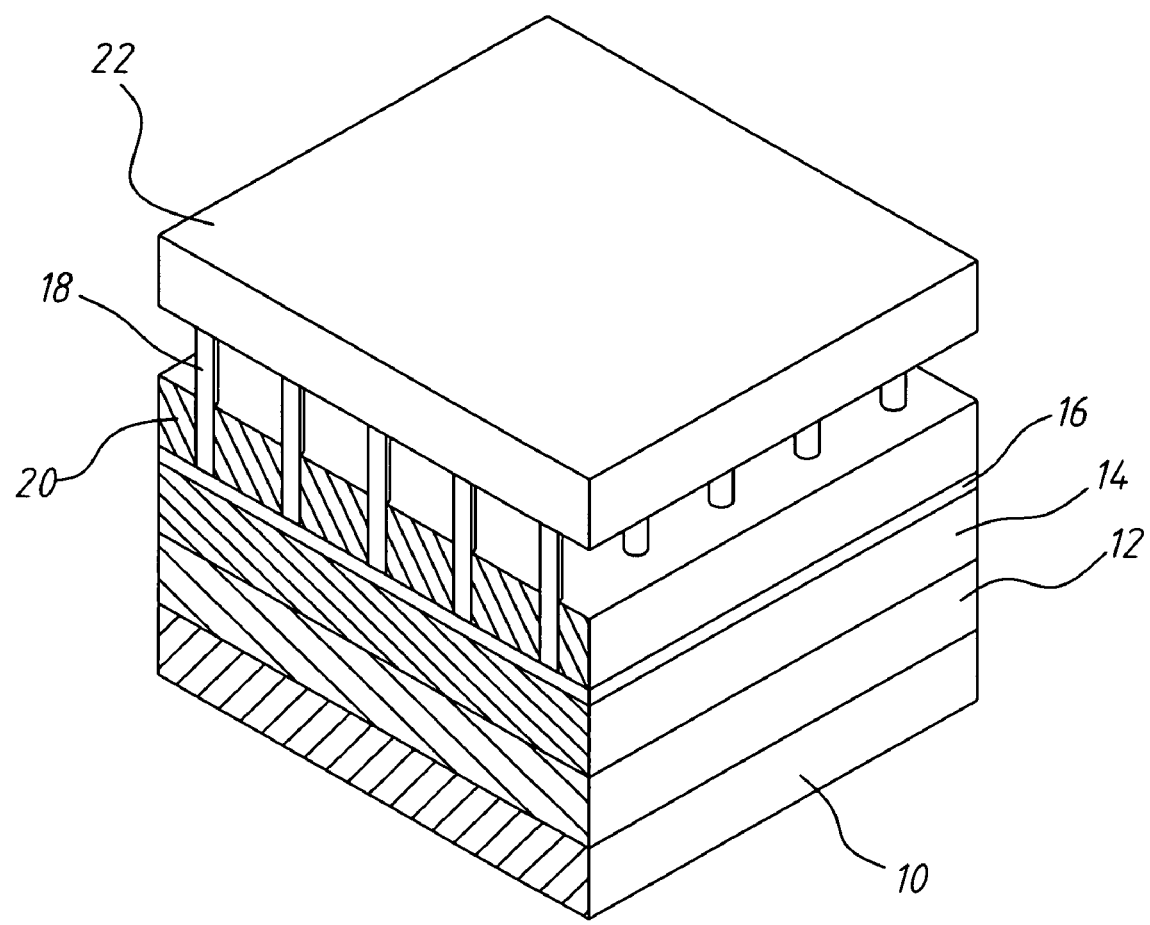
FIG. 1 is a perspective view showing an organic-inorganic lighting device according to a first embodiment of the present invention.

Refer to FIG. 1. The lighting device of the present invention comprises an insulation substrate 10, a first electrode layer 12 formed on the insulation substrate 10, an organic conductive thin-film layer 14 formed on the first electrode layer 12, a seed layer 16 formed on the organic conductive thin-film layer 14, an array of micro and nano zinc oxide wire 18 formed on the seed layer 16, and a second electrode layer 22 formed on the tips of the array of micro and nano zinc oxide wire 18. In order to prevent the second electrode layer 22 from making contact with the seed layer 16 directly, an insulation layer 20 is formed between the seed layer 16 and the second electrode layer 22. The insulation layer 20 is positioned in the gaps between each wire of the array of micro and nano zinc oxide wire 18, and the thickness of the insulation layer 20 is smaller than or equal to the length of each wire of the array of micro and nano zinc oxide wire 18. The second electrode layer 22 directly contacts a surface of the array of micro and nano zinc oxide wire 18. In this embodiment, the thickness of the insulation layer 20 which is smaller than a length of each wire of the array of micro and nano zinc oxide wire 18 is used as an example.

Figure 2:
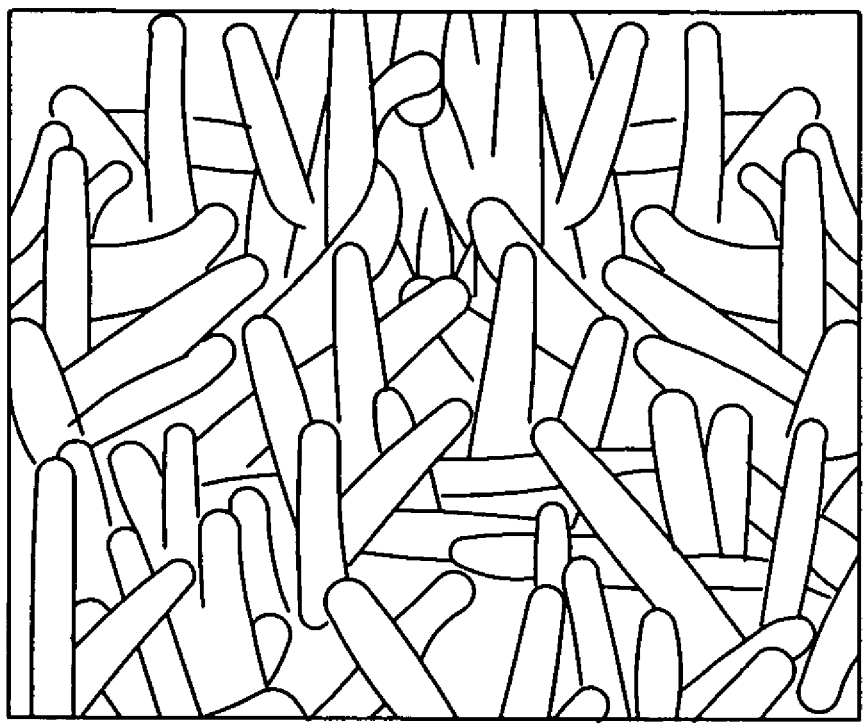
FIG. 2 is an SEM photograph of an array of micro and nano zinc oxide wire according to the present invention.

Refer to FIG. 1 and FIG. 2. An electron microscope is utilized to examine the tip of each wire of the array of micro and nano zinc oxide wire 18. Each wire of the array of micro and nano zinc oxide wire 18 doesn't have a single growth direction which is perpendicular to a surface of the seed layer 16 but each wire of the array of micro and nano zinc oxide wire 18 has all kinds of up growth directions. Therefore, when the gaps of each tip of the wires of the array of micro and nano zinc oxide wire 18 are very small, and the second electrode layer 22 is formed on the tip of the array of micro and nano zinc oxide wire 18 it is hard to contact the seed layer 16 directly.

If the gaps of each wire of the array of micro and nano zinc oxide wire 18 are very small, the second electrode layer 22 is formed on the tip of the array of micro and nano zinc oxide wire 18 and does not contact the seed layer 16. In this structure of the lighting device, the insulation layer 20 formed between the second electrode layer 22 and the seed layer 16 is omitted, and the light device of the present invention can still work well.

A conductive substrate made of silicon or a soft conductive material can replace the insulation substrate 10 and the first electrode layer 12 formed on the insulation substrate 10, and the organic conductive thin-film layer 14 is thus directly formed on the conductive substrate.

Below is a description of the material options for the above-mentioned devices. The insulation substrate 10 comprises sapphire, glass, quartz, or a soft insulating material. The first electrode layer 12 and the second electrode layer 22 comprises gold, silver, nickel, aluminum, platinum, a transparent electrode material, ITO (Indium Tin Oxide), GITO (Gallium Indium Tin Oxide), ZITO (Zinc Indium Tin Oxide), FTO (Fluorine-doped Tin Oxide), zinc oxide, AZO (Aluminum Zinc Oxide), or IZO (Indium Zinc Oxide). The insulation layer 20 comprises PMMA [poly (methyl methacrylate)], poly (styrene), SOG (Spin-On Glass), silicon dioxide ($SiO_2$), or silicon nitride ($Si_3N_4$). The seed layer 16 comprises zinc oxide, gold, tin, or cobalt.

The organic conductive thin-film layer 14 comprises a macromolecular material, a micromolecular material, an organic semiconductor material for helping the current flow, a fluorescent lighting molecule, a fluorescent lighting molecule doped phosphorescent lighting molecules, or a fluorescent lighting molecule doped organic insulation molecules, wherein the organic insulation molecule is made of PMMA or poly (styrene), and the organic semiconductor is made of P3HT [poly (3-hexylthiophene)], P3OT [poly(3-octylthiophene)], PVK [poly(N-vinylcarbazole)], MEHPPV (poly [2-methoxy-5-(2-ethylhexyloxy)-(1,4-phenylenevinylene)], MDMOPPV (poly[2-methoxy-5-(3',7'-dimethyloctyloxy)-1, 4-phenylenevinylene]) PF[poly(fluorine)], or TPD [N'-diphenyl-N,N'-bis[3-methylphenyl]-[1,1'-biphenyl]-[4,4'-diamine]].

Below is a description of the size of the above-mentioned devices. The organic conductive thin-film layer 14 has a thickness of between 10 nm and 1000 nm. The seed layer 16 has a thickness of between 1 nm and 100 nm. The insulation layer 20 has a thickness of between 1 nm and 50 μm. The gap distance of each wire of the array of micro and nano zinc oxide wire 18 is between 0.5 nm and 500 μm. The length of each wire of the array of micro and nano zinc oxide wire 18 is between 2 nm and 50 μm, and the section contacting the seed layer 16 of each wire of the array of micro and nano zinc oxide wire 18 has a width of between 2 nm and 10 μm. The total length added by the wires of the array of micro and nano zinc oxide wire 18 and the thickness of the seed layer 16 is between 15 nm and 50 μm.

Figure 3A:
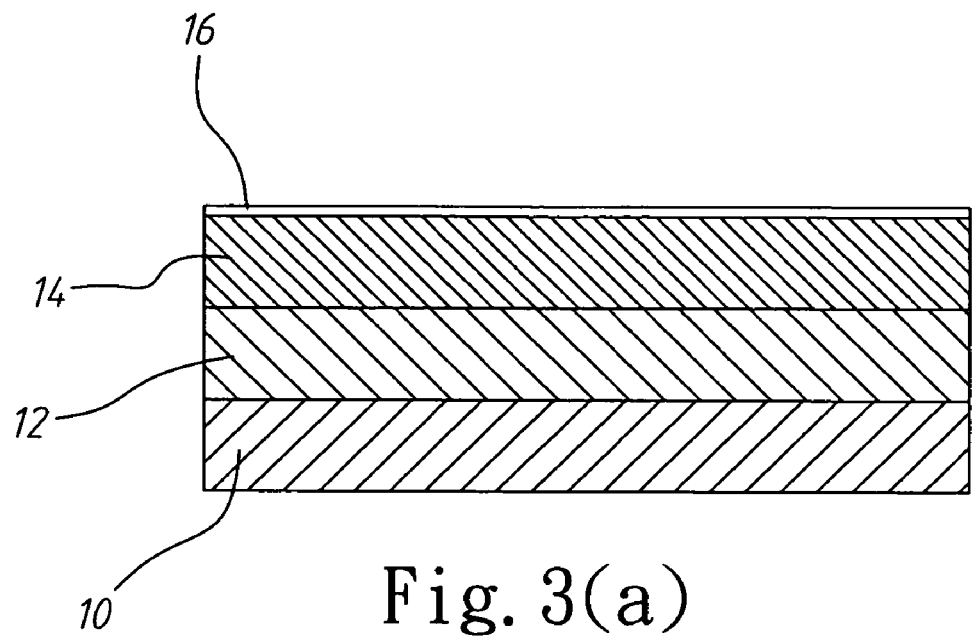
FIGS. 3(a)-3(e) are sectional views showing a method for fabricating the organic-inorganic lighting device according to the first embodiment of the present invention.

Refer to FIGS. 3(a)-3(k) for the method to fabricate the organic-inorganic lighting device of the first embodiment. As shown in FIG. 3(a), an insulation substrate 10 is provided firstly. Next, a first electrode layer 12, an organic conductive thin-film layer 14 and a seed layer 16 are sequentially formed on the insulation substrate 10. The organic conductive thin-film layer 14 is fabricated using one of the following methods: spin-coating method, dip-coating method, or ink printing method. The spin-coating method, dip-coating method and ink printing method require one of the following solutions: chloroform, dichloromethane, toluene, tetrahydrofuran, 1,2-dichlorobenzene, 1,4-dichlorobenzene, chlorobenzene, or n-hexane.

The seed layer 16 is fabricated using one of the following methods: spin-coating method, dip-coating method, evaporation method, sputtering method, atomic layer deposition method, electrochemical deposition method, pulsed laser deposition method, or metalorganic chemical vapor method. When the seed layer 16 comprises gold, tin, or cobalt, the seed layer 16 is fabricated via applying micro and nano particles of gold, tin, or cobalt onto the organic conductive thin-film layer 14 with an evaporation method or a sputtering method, wherein the diameter of the micro and nano particle of gold is between 2 nm and 10 μm. When the seed layer 16 comprises zinc oxide, gold, tin, or cobalt, the seed layer 16 is fabricated via applying micro and nano particles of gold, tin, cobalt, or zinc oxide onto the organic conductive thin-film layer 14 with a spin-coating method or a dip-coating method, wherein the diameter of the micro and nano particle of zinc oxide is between 2 nm and 10 μm and the diameter of the micro and nano particle of gold is between 2 nm and 10 μm. The abovementioned spin-coating method or dip-coating method requires one of the following solutions for varying the hydrophilic property of the seed layer 16: isopropanol, methanol, ethyl alcohol, glycerol, or propanol.

Figure 3B:
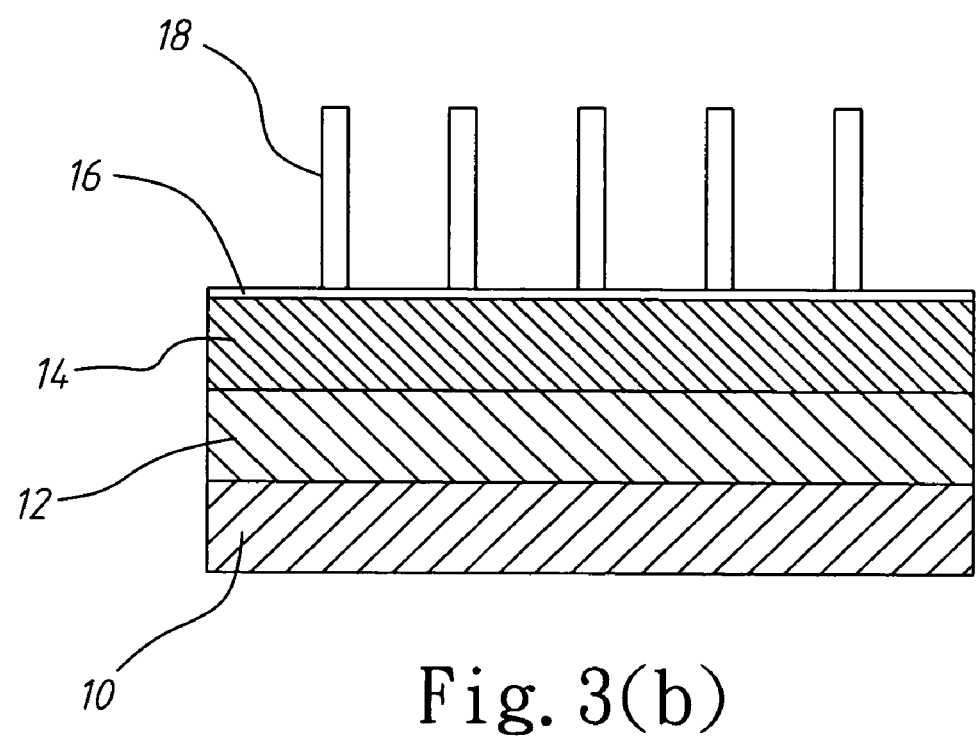

Next, as shown in FIG. 3(b), an array of micro and nano zinc oxide wire 18 is formed on the seed layer 16 by using the properties of the seed layer 16. The array of micro and nano zinc oxide wire 18 is fabricated using one of the following methods: hydrothermal method, thermal evaporation method, chemical vapor deposition method, molecular beam epitaxy method, anodic aluminum oxide method, or electrochemical method.

Figure 3C:
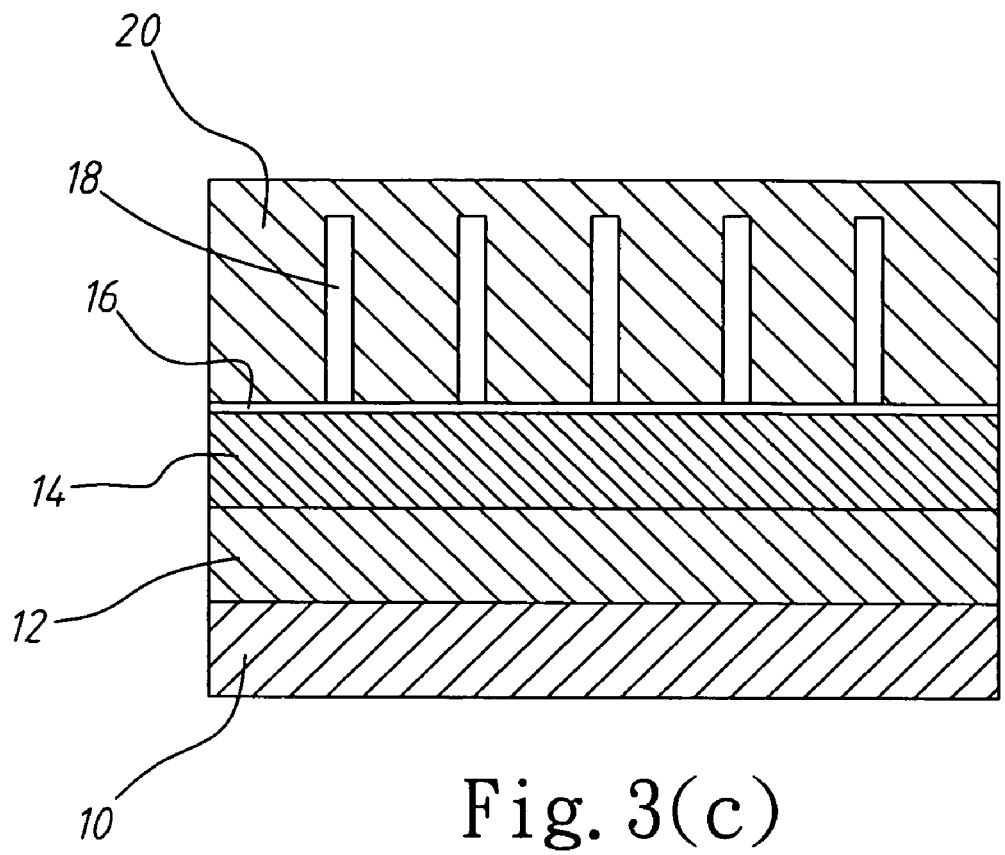
Figure 3D:
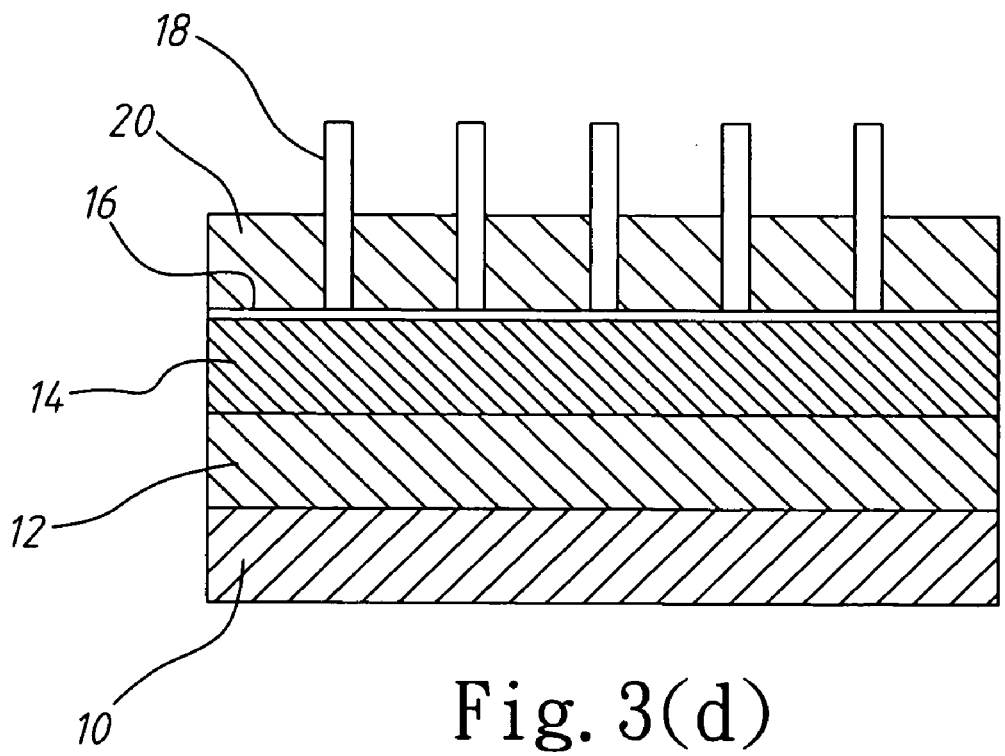

Next, as shown in FIG. 3(c), an insulation layer 20 is formed on the seed layer 16 to cover the seed layer 16 and the array of micro and nano zinc oxide wire 18. The insulation layer 20 is fabricated using one of the following methods: spin-coating method, dip-coating method, evaporation method, sputtering method, atomic layer deposition method, electrochemical deposition method, pulsed laser deposition method, or metalorganic chemical vapor method. Next, as shown in FIG. 3(d), the insulation layer 20 is etched to have a thickness which is smaller than or equal to the length of each wire of the array of micro and nano zinc oxide wire 18. In this embodiment, a thickness of the insulation layer 20 which is smaller than a length of each wire of the array of micro and nano zinc oxide wire 18 is used as an example.

Figure 3E:
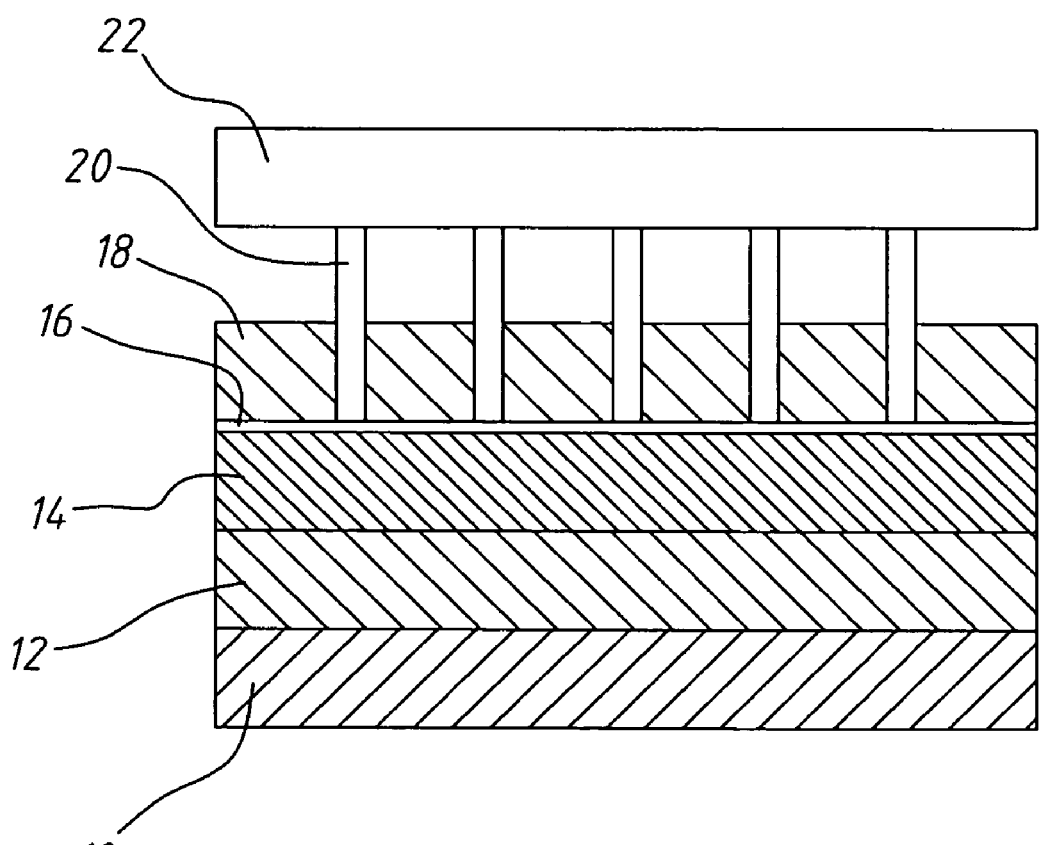

Finally, as shown in FIG. 3(e), a second electrode layer 22 is formed on the top surface of the array of micro and nano zinc oxide wire 18. Therefore, the insulation layer 20 is formed between the seed layer 16 and the second electrode layer 22 and positioned in the gaps between each wire of the array of micro and nano zinc oxide wire 18.

The insulation layer 20 may be omitted from the above-mentioned lighting device of the present invention. Such a structure of the lighting device can be achieved by cancelling the steps shown in FIG. 3(c) and FIG. 3(d).

In the step of providing an insulation substrate 10 and forming a first electrode layer 12 shown in FIG. 3(a), a conductive substrate may replace the insulation substrate 10 and the first electrode layer 12 and the organic conductive thin-film layer is formed on the conductive substrate directly.

Figure 4:
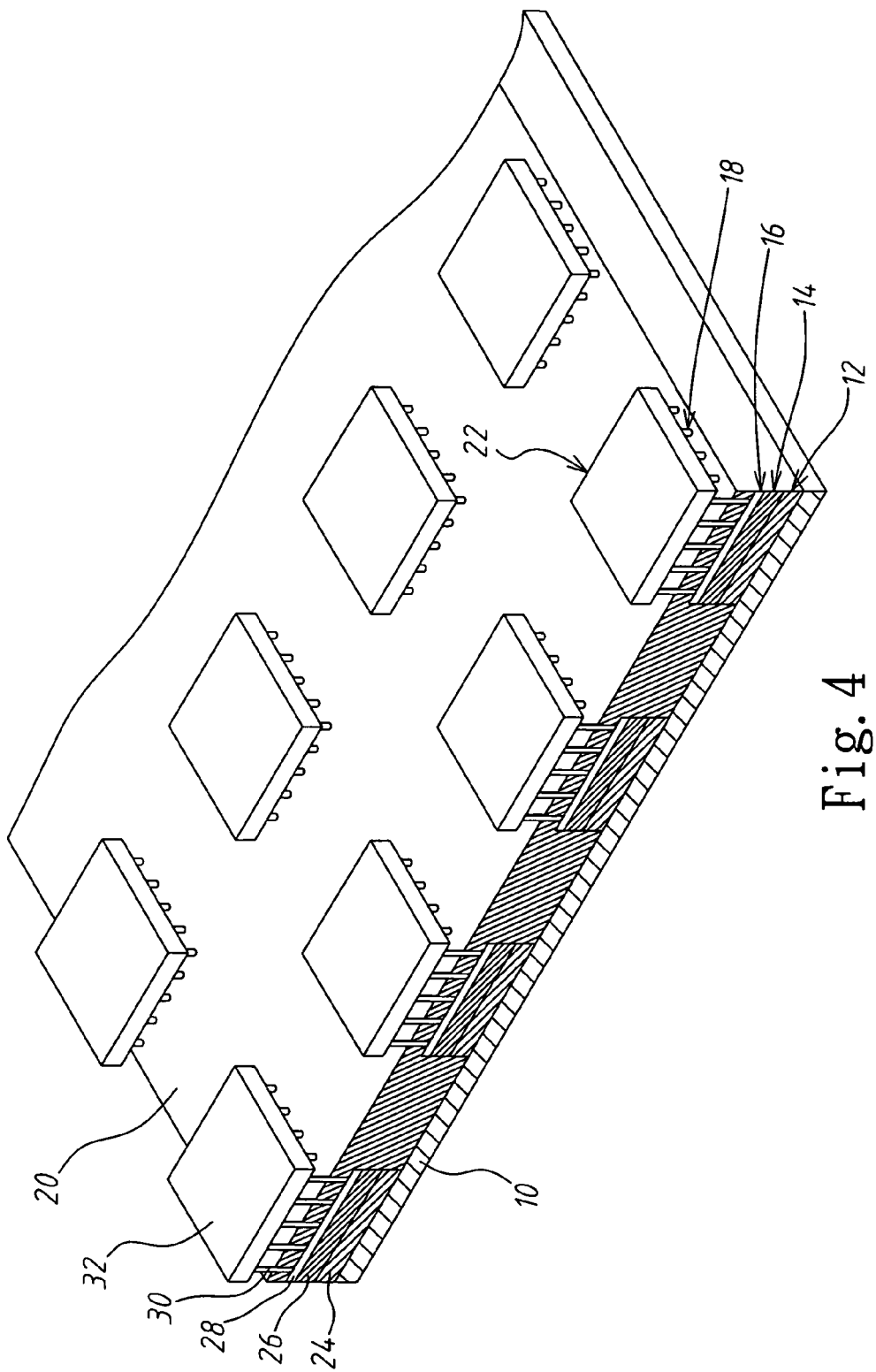
FIG. 4 is a perspective view showing an organic-inorganic lighting device according to a second embodiment of the present invention.

Refer to FIG. 4 for a second embodiment of the present invention. The second embodiment is different from the first embodiment in that the first electrode layer 12 is divided into a plurality of first electrode blocks 24, and the first electrode blocks 24 are arranged equidistantly. The organic conductive thin-film layer 14 and the seed layer 16 are respectively divided into a plurality of organic blocks 26 and seed blocks 28; the array of micro and nano zinc oxide wire 18 is divided into a plurality of groups of micro array of zinc oxide 30, and the second electrode layer 22 is divided into a plurality of second electrode blocks 32. An organic block 26, a seed block 28, and a group of micro array of zinc oxide 30, are formed on each first electrode block 24 in order. The insulation layer 20 covers the seed layer 16 and the insulation substrate 10, and the top surface of the insulation layer 20 is lower than the tips of the array of micro and nano zinc oxide wire 18.

Figure 5A:
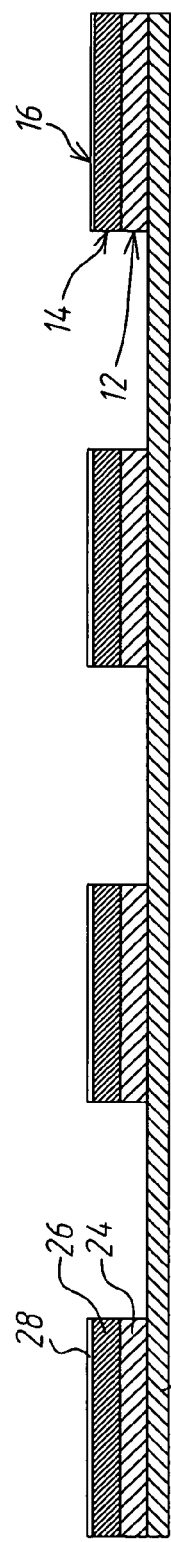
FIGS. 5(a)-5(e) are sectional views showing a method for fabricating the organic-inorganic lighting device according to the second embodiment of the present invention.
Figure 5B:
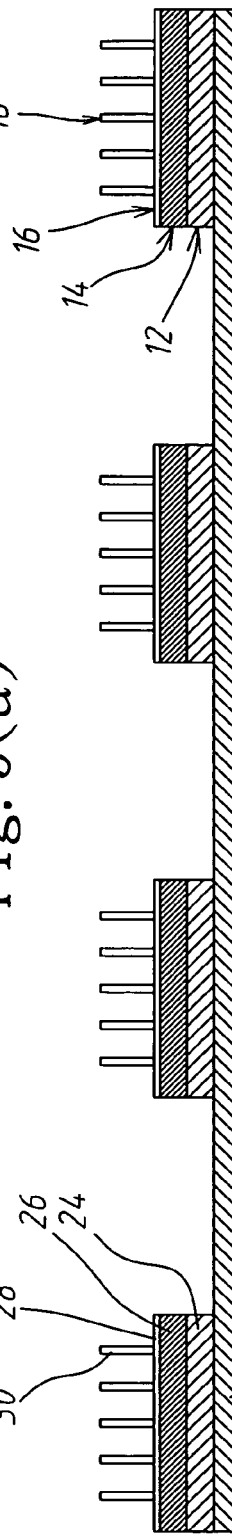
Figure 5C:
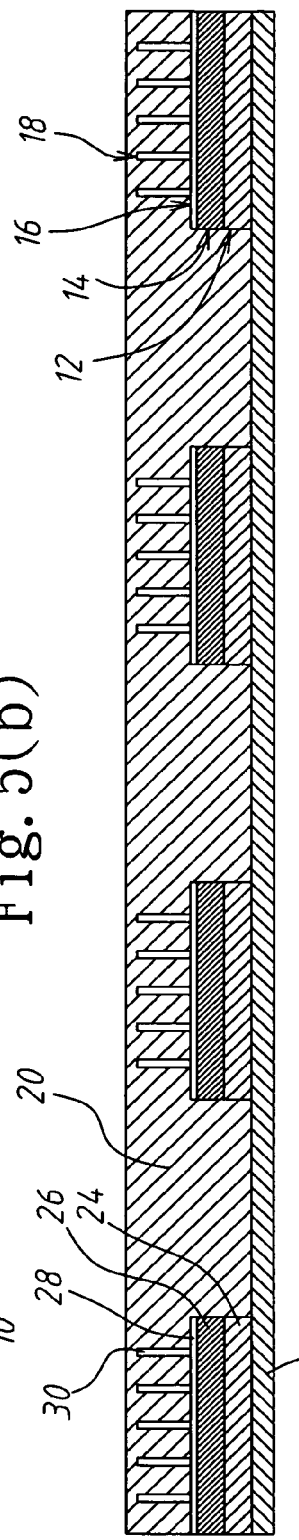
Figure 5D:
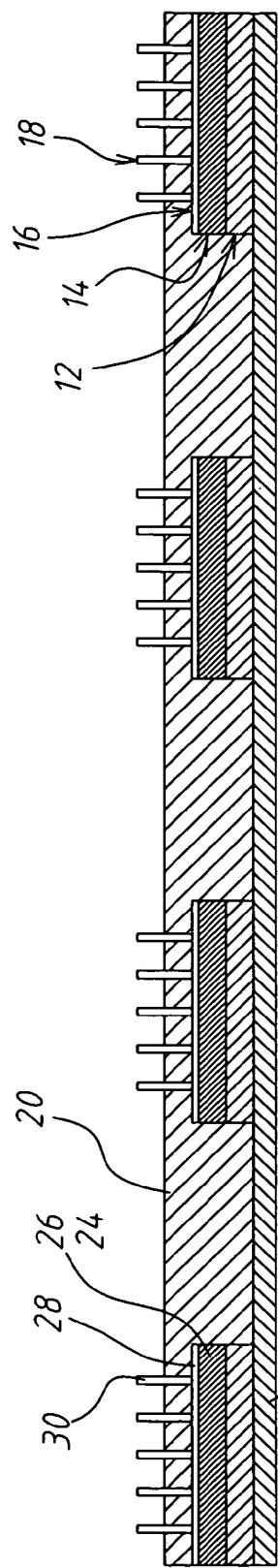
Figure 5E:
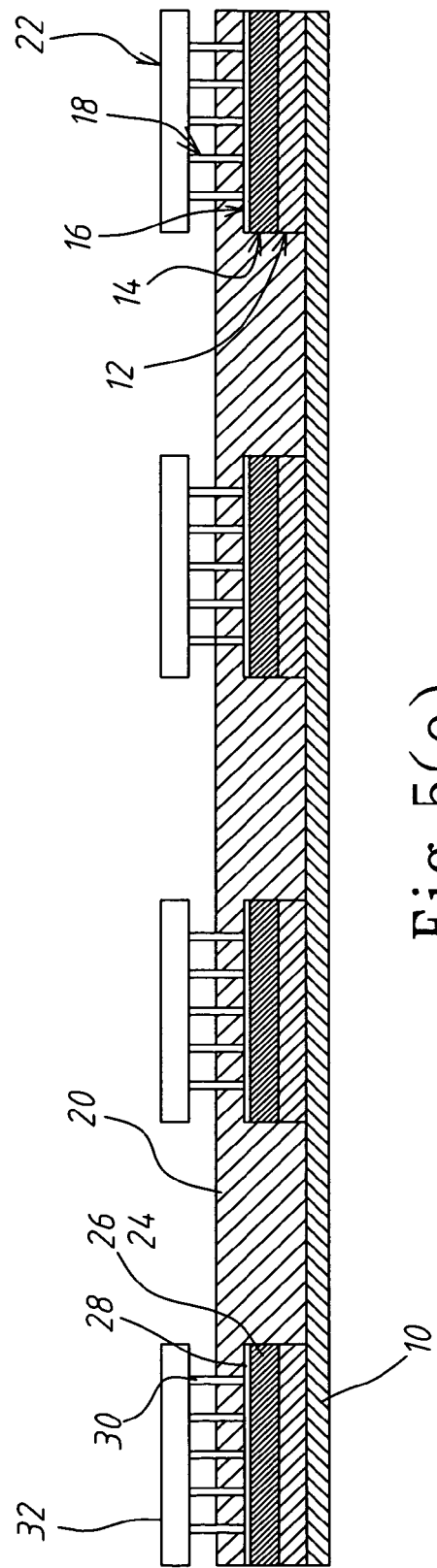

Refer to FIGS. 5(a)-5(e) for the method of fabricating the organic-inorganic lighting device of the second embodiment. The method of fabricating the second embodiment is similar to the first embodiment. Below is a description of the differences between the fabricating methods of the second embodiment and the first embodiment. As shown in FIG. 5(a), the first electrode layer 12 formed in a plurality of electrode blocks is formed on the insulation substrate 10, and the first electrode blocks 24 are arranged equidistantly. An organic block 26 and a seed block 28 are sequentially formed on each first electrode block 24. Next, as shown in FIG. 5(b), a group of micro array of zinc oxide 30 is formed on each seed layer 28. Next, as shown in FIG. 5(c), an insulation layer 20 is formed on the seed layer 16 to cover the seed layer 16, the insulation substrate 10 and the array of micro and nano zinc oxide wire 18. Next, as shown in FIG. 5(d), the insulation layer 20 is etched to have a height of the top surface which is lower than the tips of the array of micro and nano zinc oxide wire 18. Finally, as shown in FIG. 5(e), a second electrode block 32 is formed on the top surface of each group of the micro array of zinc oxide 30.

Figure 6:
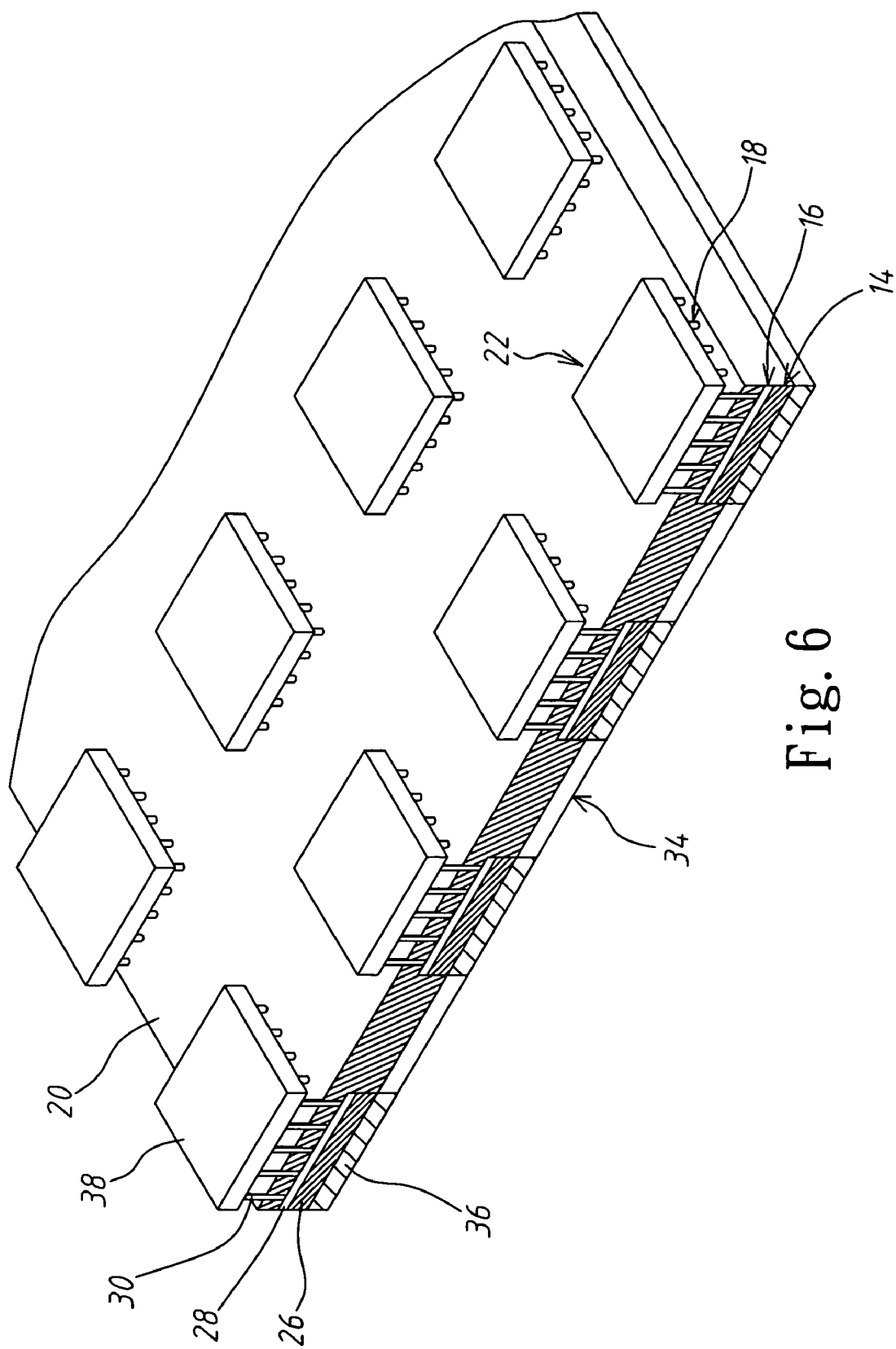
FIG. 6 is a perspective view showing an organic-inorganic lighting device according to a third embodiment of the present invention.

Refer to FIG. 6 for a third embodiment of the present invention. The third embodiment is different from the second embodiment in that a conductive substrate 34 replaces the insulation substrate 10 and the first electrode layer 12. The conductive substrate 34 has a plurality of conductive blocks 36 arranged equidistantly. An organic block 26, a seed block 28, and a group of micro array of zinc oxide 30, are formed on the each conductive block 36 in order.

Figure 7A:
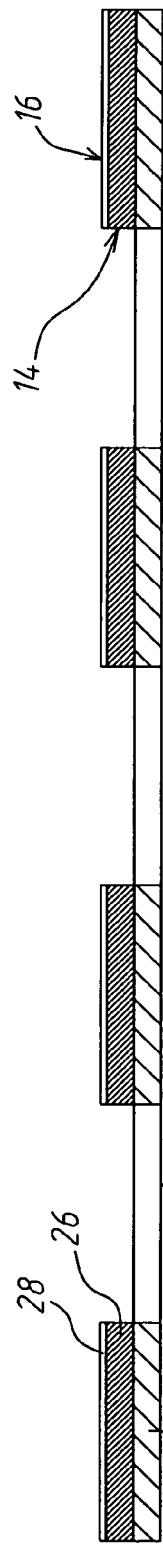
Figure 7B:
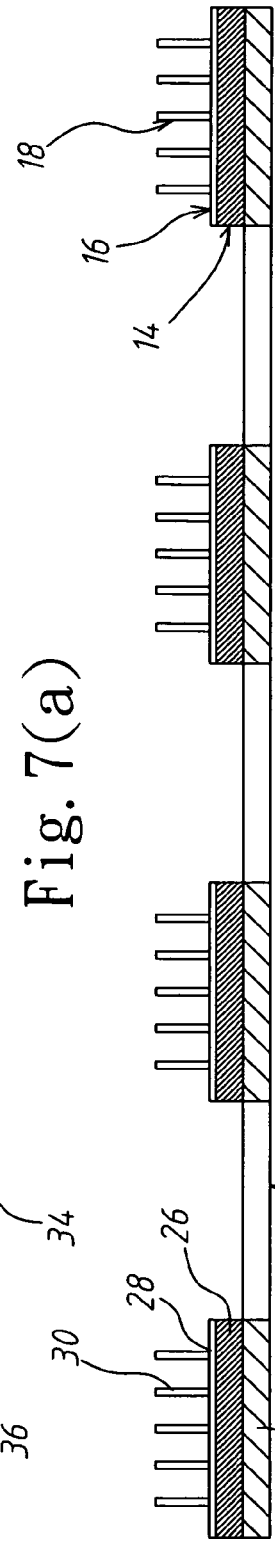
Figure 7C:
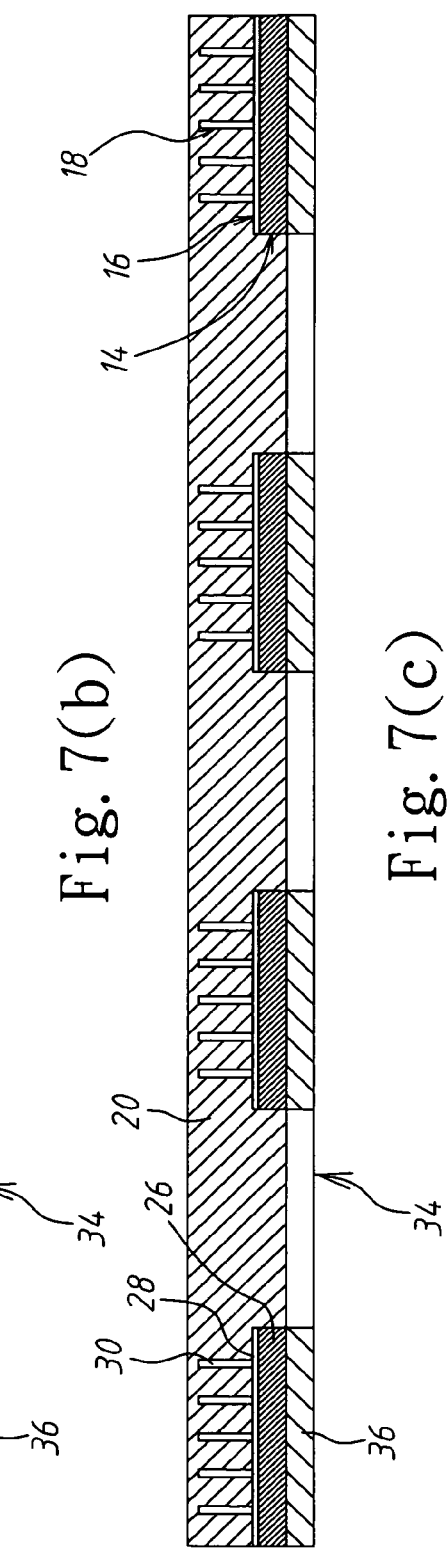

Refer to FIGS. 7(a)-7(e) for the method of fabricating the organic-inorganic lighting device of the third embodiment. Firstly, as shown in FIG. 7(a), a conductive substrate 34 having a plurality of conductive blocks 36 arranged equidistantly is provided. Next, an organic block 26 and a seed layer 28 are sequentially formed on each conductive block 36. The steps shown in FIG. 7(b) to FIG. 7(e) are identical to the steps shown in FIG. 5(b) to FIG. 5(e), and have been described previously so will not be reiterated.

Figure 8A:
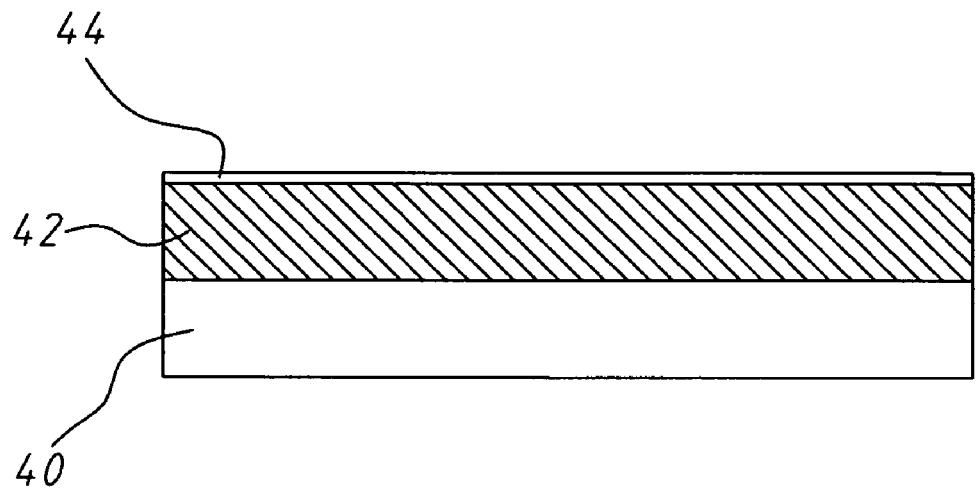
FIGS. 8(a)-8(e) are sectional views showing a method for fabricating the organic-inorganic lighting device in detail according to the present invention.

Below is a description of the process of fabricating the organic-inorganic lighting device of the present invention in detail. Refer to FIGS. 8(a)-8(e). As shown in FIG. 8(a), a conductive substrate 40 made of ITO is provided firstly. Next, an organic conductive thin-film layer 42 made of P-type P3HT is fabricated using a spin-coating method on the conductive substrate 40, and then the sample is subsequently annealed at 120° C. for 2 hours to remove the solvent. Next, the seeding solution containing glycerol and micro and nano particles of zinc oxide is applied onto the organic conductive thin-film layer 42 using a spin-coating method, and then heated at 120° C. to form a seed layer 44. The reason why glycerol is used is that the seed layer 44 of zinc oxide having a hydrophilic property and the organic conductive thin-film layer 42 having a hydrophobic property repel each other and do not combine easily. Therefore, as long as the alcohols are used on the process to fabricate the seed layer 44, a hydrophilic property of the seed layer 44 is varied. Thus, the seed layer 44 is formed on the organic conductive thin-film layer 42 successfully, and the method for fabricating the seed layer 44 is used for an arbitrary substrate to substantially increase the applicability of devices.

Figure 8B:
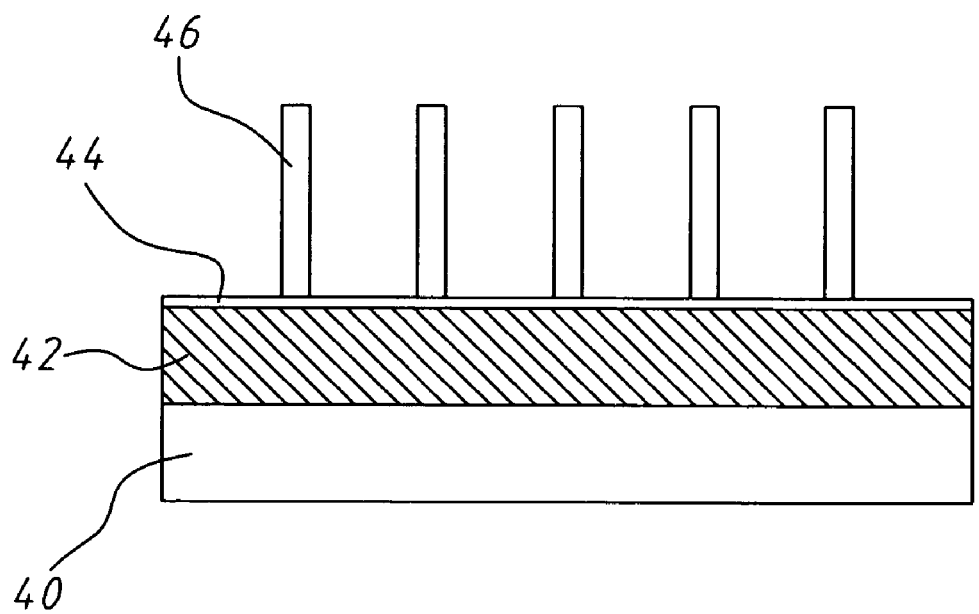

Next, as shown in FIG. 8(b), hydrothermal growth of an N-type array of micro and nano zinc oxide wire 46 formed on the seed layer 44 is achieved by suspending the sample upside down in an aqueous solution of zinc nitrate and hexamethylenetetramine at a low temperature of 90° C. for 3 hours.

Figure 8C:
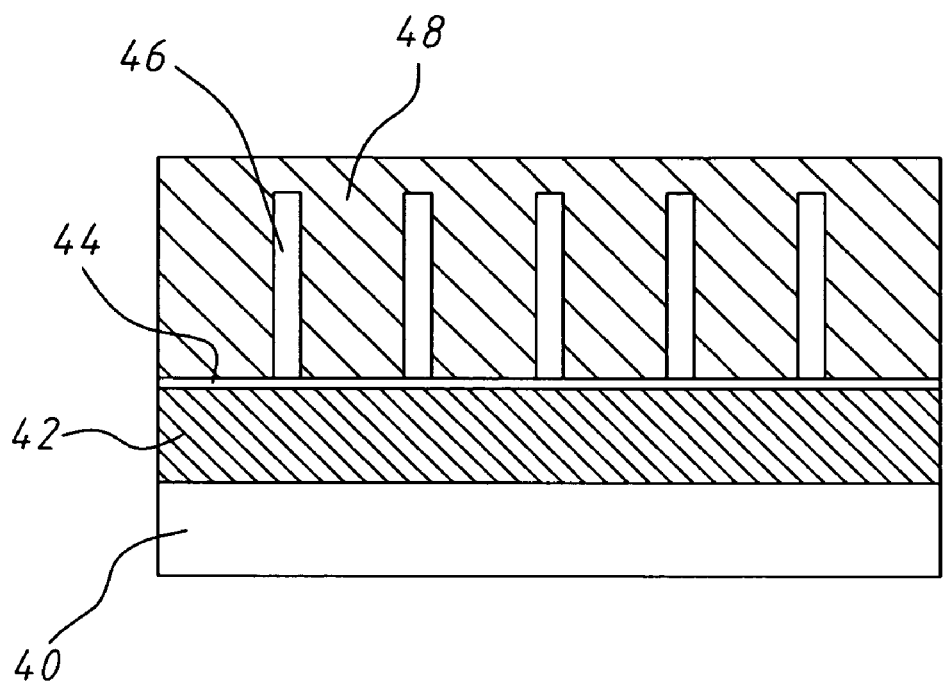

Next, as shown in FIG. 8(c), an insulation layer 48 made of PMMA is formed on the seed layer 44 using a spin-coating method to cover the seed layer 44 and the array of micro and nano zinc oxide wire 46, wherein the insulation layer 48 can isolate each wire of the array of micro and nano zinc oxide wire 46 electrically.

Figure 8D:
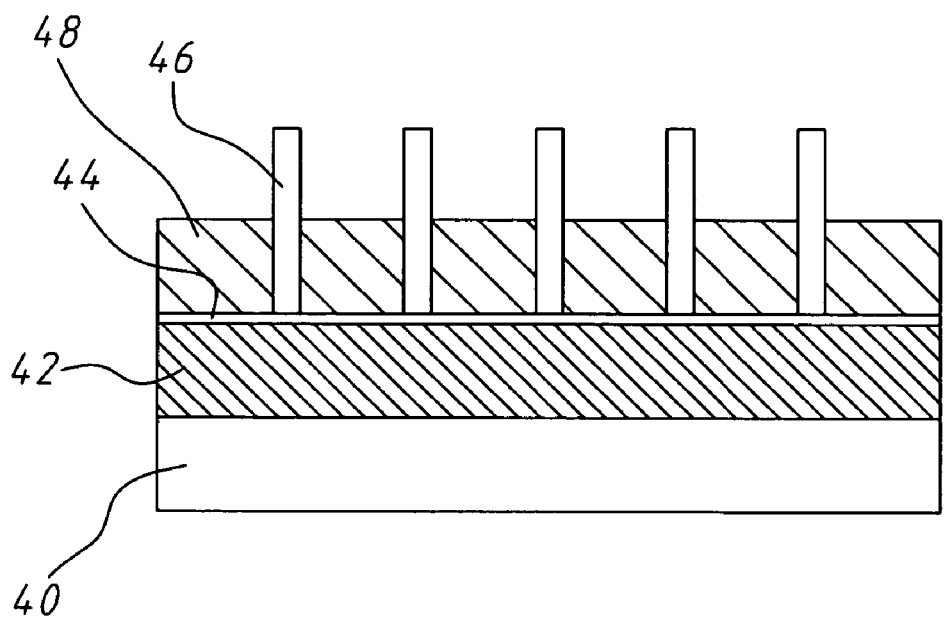
Figure 8E:
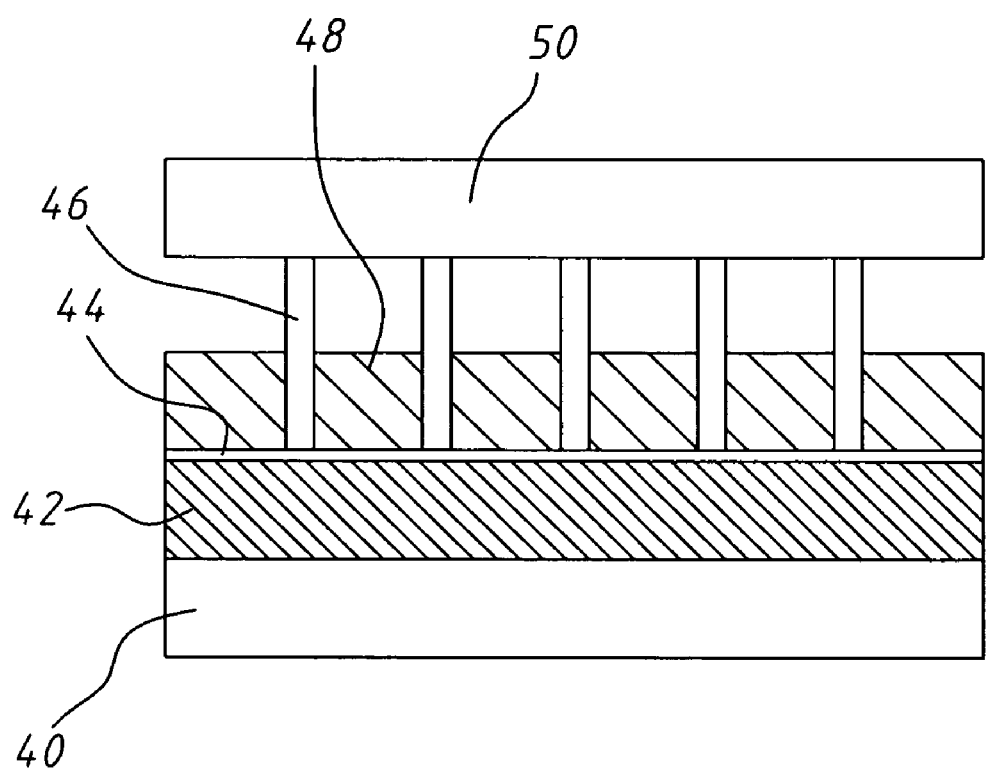

Afterwards, as shown in FIG. 8(d), the insulation layer 48 is etched by oxygen plasma to have a top surface which is lower than the tips of the array of micro and nano zinc oxide wire 46. Finally, as shown in FIG. 8(e), an electrode layer 50 made of aluminum is formed on the tips of the array of micro and nano zinc oxide wire 46. According to the above-mentioned, using a low cost and low temperature liquid process is provided. The technology of the present invention is not only used for a hard substrate but also used for a soft substrate. The technology of the present invention is used for a large-area substrate to substantially increase the applied level of the present invention. Moreover, the present invention is not restricted by the problems of the epitaxial materials and the mismatch of lattice constant of a substrate, and the present invention can solve the bottleneck during the epitaxial process. In other words, the present invention not only differs from the traditional epitaxial process with a small-area substrate and complex equipment, but also reduces the fabrication cost. Therefore, the present invention is a very useful innovation.

Figure 9:
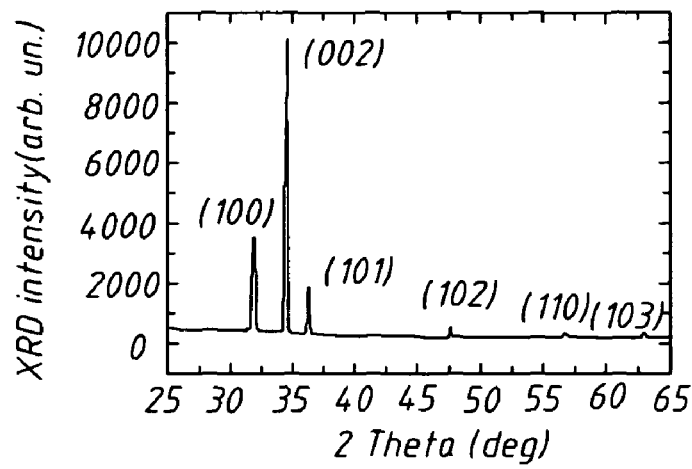
FIG. 9 is an XRD pattern of an array of micro and nano zinc oxide wire according to the present invention.

Refer to FIG. 9. FIG. 9 is an XRD (X-ray diffractometry) pattern of an array of micro and nano zinc oxide wire of the above-mentioned finished sample after the fabricating process. The crystallinity of the array of micro and nano zinc oxide wire is examined at room temperature by XRD with Cu Kα radiation operating at 40 kV and 25 mA, and a scan rate of 3 degree/min. In FIG. 9, several diffraction peaks could be observed at $2\delta=31.74°$, $34.44°$, $36.26°$, $47.48°$, $56.66°$ and $62.93°$, which are due to zinc oxide (100), (002), (101), (102), (110) and (103), respectively. The diffraction peaks prove that the structure of the array of micro and nano zinc oxide wire of the present invention is a hexagonal wurtzite structure, and that each wire of the array of micro and nano zinc oxide wire doesn't have a single growth direction which is perpendicular to a surface of the seed layer. Each wire of the array of micro and nano zinc oxide wire 18 has all kinds of growth directions.

Figure 10:
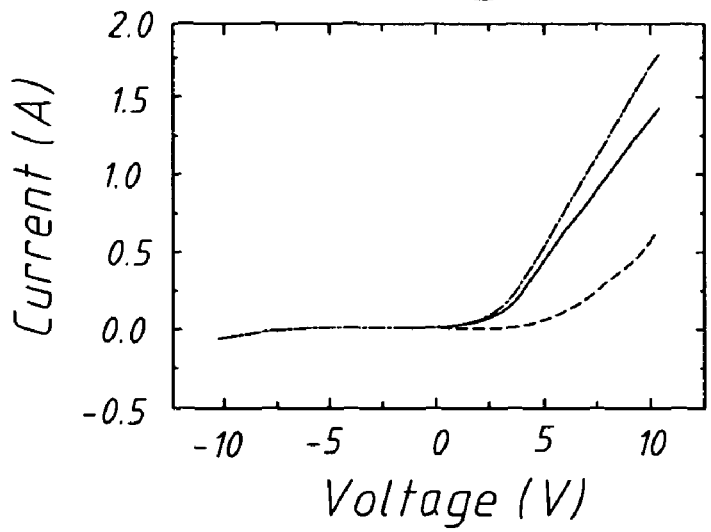
FIG. 10 is a current-voltage graph comparing a lighting device structure containing P3HT (poly-3-hexylthiophene) with other lighting device structures according to the present invention.

Refer to FIG. 10. The long-short dash line represents the surveying data of the above-mentioned finished sample after the fabricating process, wherein the thickness of the organic conductive thin-film layer is 240 nm. This kind of the sample is called sample A in the following description. The solid line represents the surveying data of the above-mentioned finished sample after the fabricating process, wherein the thickness of the organic conductive thin-film layer is 300 nm. This kind of the sample is called sample B in the following description. The long dash line represents the surveying data of the sample comprising an ITO substrate, an organic conductive thin-film layer formed on the ITO substrate and an electrode layer formed on the organic conductive thin-film layer, wherein the organic conductive thin-film layer and the electrode layer are made of P3HT and aluminum respectively. This kind of the sample is called sample C in the following description. According to FIG. 10, the driving voltage of sample A and sample B is almost at 2 V, which is lower than the driving voltage of sample C. When a voltage of 10 V is biased, the current of sample A is higher than that of sample B, and the current of sample B is higher than that of sample C. This phenomenon is attributed to two main reasons. Firstly, the carrier mobility of the heterostructure between the organic conductive thin-film layer and the array of micro and nano zinc oxide wire is higher than that of P3HT film only. Moreover, the injection area of the heterostructure between the organic conductive thin-film layer and the array of micro and nano zinc oxide wire is larger than that of P3HT film only. According to these two main reasons, the current of sample A is higher than that of sample C, and the driving voltage of sample C is higher than that of sample A. Additionally, the current of sample A is higher than that of sample B because the thickness of the organic conductive thin-film layer of sample A is thinner than that of sample B.

Figure 11:
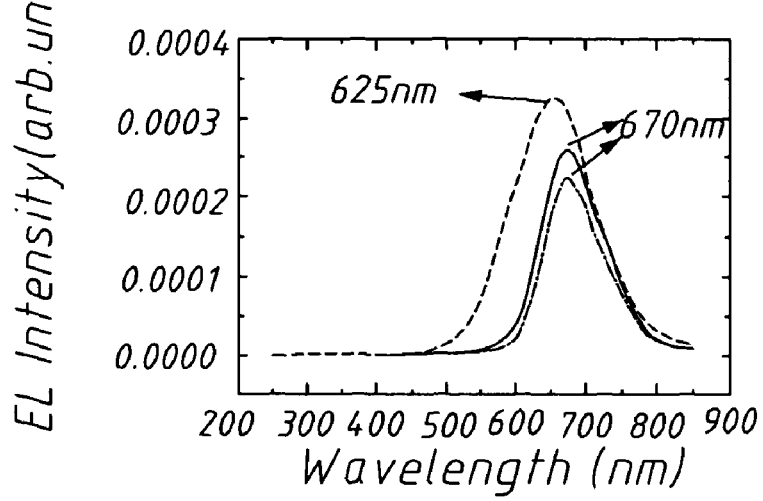
FIG. 11 is a lighting intensity-wavelength graph comparing a lighting device structure containing P3HT with other lighting device structures according to the present invention.

In order to realize the relationship between sample A and sample B further, refer to FIG. 11. The long dash line represents the surveying data of sample A. The solid line represents the surveying data of sample B. The long-short dash line represents the surveying data of the sample C. The DC voltage of 10 V is biased in order to make the three kinds of samples radiate light. According to FIG. 11, by comparing sample A and sample C, the emission intensity of sample A has increased 1.5 times and the spectrum peak of sample A has slightly shifted from 670 nm to 652 nm. It is speculated that the growth of the array of micro and nano zinc oxide wire on top of the organic conductive thin-film layer induces a change in the local electronic structure of the surface of P3HT due to the interaction between the P3HT molecules and the hydroxyl groups of the array of micro and nano zinc oxide wire surface. This leads to a blue-shifted and broadening EL (electro luminescent) spectrum while carriers recombine in the interface between the array of micro and nano zinc oxide wire and P3HT. In addition, it is clear that the array of micro and nano zinc oxide wire enhances carrier injection to increase the probability of electron-hole recombination in the EL device. This sample A is used to fabricate a white, blue, red, or green EL lighting device.

On the contrary, sample B demonstrates an EL emission peak at 670 nm totally corresponding to sample C without any shift. The above results account for two phenomena: (1) the location of the carrier recombination between zinc oxide and P3HT strongly depends on the thickness of P3HT, and (2) the array of micro and nano zinc oxide wire cause the blue-shifted emission when carrier recombination occurs in the interface between the array of micro and nano zinc oxide wire and the P3HT.

Figure 12:
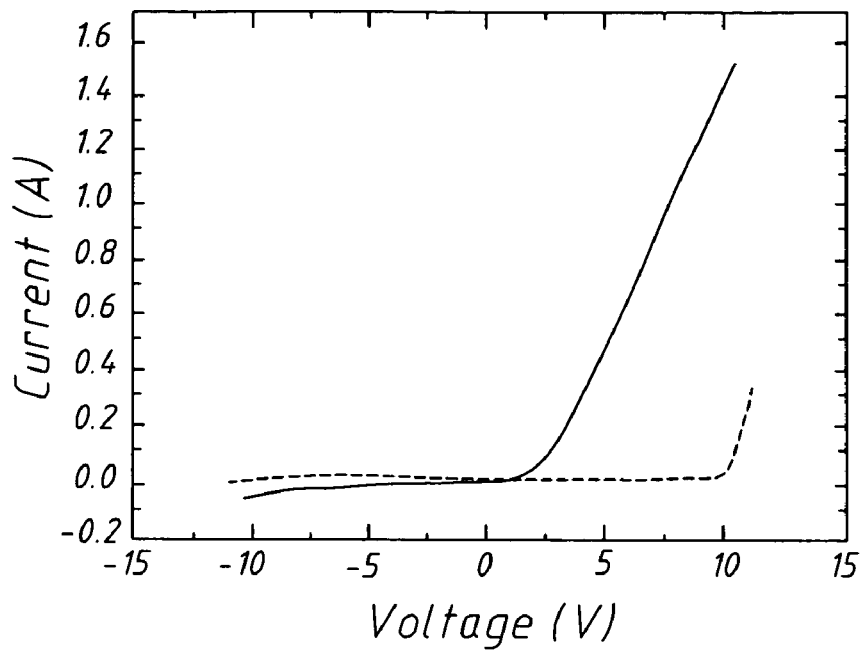
FIG. 12 is a lighting current-voltage graph comparing a lighting device structure containing PF[poly(fluorine)] with other lighting device structures according to the present invention.

Refer to FIG. 12. The dash line represents the surveying data of sample D, wherein the structure of sample D is similar to that of sample C. Sample D is different from sample C in that the organic conductive thin-film layer made of PF replaces the organic conductive thin-film layer made of P3HT. The solid line represents the surveying data of sample E, wherein the structure of sample E is similar to that of sample A. Sample E is different from sample A in that the organic conductive thin-film layer made of PF replaces the organic conductive thin-film layer made of P3HT. According to FIG. 12, when the voltage of 10 V is biased, sample E is 5 times the current of sample D.

Figure 13:
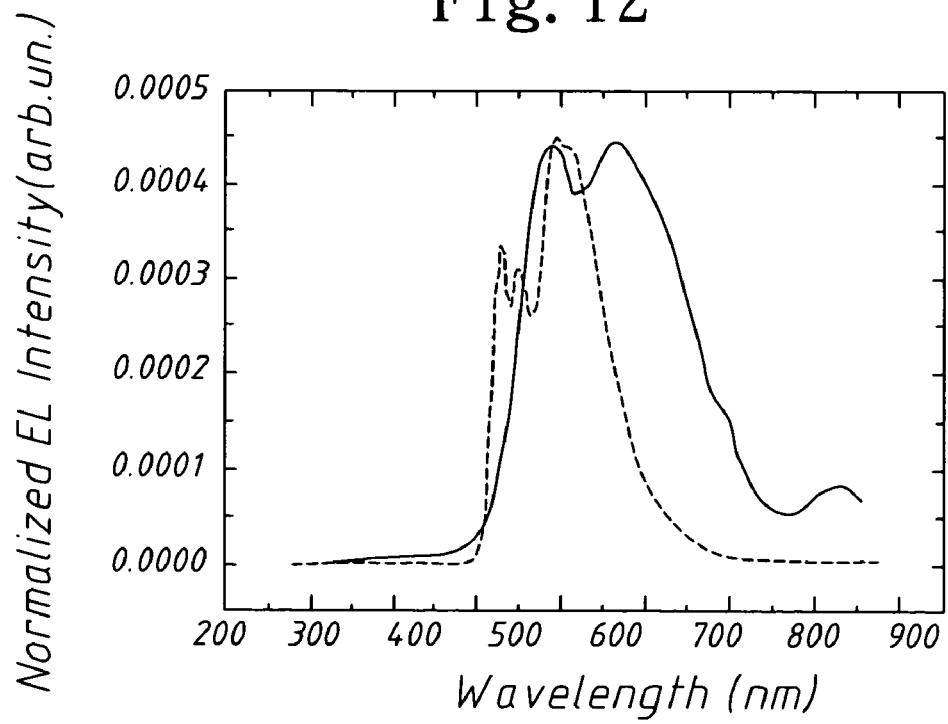
FIG. 13 is a normalized lighting intensity-wavelength graph comparing a lighting device structure containing PF with other lighting device structures according to the present invention.

Refer to FIG. 13. The dash line and the solid line represent the surveying data of sample D and sample E respectively. The DC voltage of 12 V is biased in order to make the two kinds of samples radiate light. According to FIG. 13, the emission peaks of sample D are at 426 nm, 450 nm, and 491 nm. For sample E at the same forward bias of 12 V, it shows the red-shifted and broadening emission peak at 483 nm and 566 nm. The phenomenon is attributed to the interaction between the PF molecules and the array of micro and nano zinc oxide wire. During hydrothermal process, the reaction of hydroxyl groups of zinc oxide surface with PF on the surface of micro and nano wires have taken place and the polymer chains of PF were grafted on the surface of micro and nano zinc oxide wires. The grafting reaction causes the reduction in the luminescence energy and red-shifted emission peak.

In conclusion, the present invention not only solves the difficult problems of low electron mobility in organic materials and epitaxial process of an inorganic diode in a vacuum and high-temperature environment with expensive equipment but also greatly reduces the fabrication cost. Therefore, the present invention is a very useful innovation.

The embodiments described above are only to exemplify the present invention but not to limit the scope of the present invention. Therefore, any equivalent modification or variation according to the spirit of the present invention is to be also included within the scope of the present invention.

What is claimed is:

1. An organic-inorganic lighting device comprising:
   a conductive substrate;
   an organic conductive thin-film layer formed on said conductive substrate;
   a seed layer formed on said organic conductive thin-film layer;
   an array of micro and nano zinc oxide wire formed on said seed layer; and
   a first electrode layer formed on said array of micro and nano zinc oxide wire.

2. The organic-inorganic lighting device according to claim 1, wherein said conductive substrate comprises:
   an insulation substrate; and
   a second electrode layer formed on said insulation substrate, and said organic conductive thin-film layer is formed on said second electrode layer.

3. The organic-inorganic lighting device according to claim 2, wherein said insulation substrate comprises sapphire, glass, quartz, or a soft insulating material and said insulation substrate comprises silicon or a soft conductive material.

4. The organic-inorganic lighting device according to claim 1, wherein when said first electrode layer is formed in a plurality of electrode blocks, said conductive substrate is formed in a plurality of conductive blocks, and said organic conductive thin-film layer is formed on said conductive blocks.

5. The organic-inorganic lighting device according to claim 1 further comprising an insulation layer arranged between said first electrode layer and said seed layer and positioned in gaps between each wire of said array of micro and nano zinc oxide wire, and said first electrode layer directly contacts a surface of said array of micro and nano zinc oxide wire.

6. The organic-inorganic lighting device according to claim 5, wherein thickness of said insulation layer is less than or equal to a length of each wire of said array of micro and nano zinc oxide wire.

7. The organic-inorganic lighting device according to claim 1, wherein said seed layer comprises zinc oxide, gold, tin, or cobalt.

8. A method for fabricating an organic-inorganic lighting device, comprising steps of:
   providing a conductive substrate and forming an organic conductive thin-film layer on said conductive substrate;
   forming an array of micro and nano zinc oxide wire on a seed layer; and
   forming a first electrode layer on said array of micro and nano zinc oxide wire.

9. The method for fabricating an organic-inorganic lighting device according to claim 8, wherein said step of providing said conductive substrate comprises steps of:
   providing an insulation substrate; and
   forming a second electrode layer on said insulation substrate, wherein said organic conductive thin-film layer is formed on said second electrode layer.

10. The method for fabricating an organic-inorganic lighting device according to claim 9, wherein said insulation substrate comprises sapphire, glass, quartz, or a soft insulating material and said insulation substrate comprises silicon or a soft conductive material.

11. The method for fabricating an organic-inorganic lighting device according to claim 8, wherein an insulation layer is formed between said seed layer and said first electrode layer, said insulation layer is positioned in gaps between each wire of said array of micro and nano zinc oxide wire, and said first electrode layer directly contacts a surface of said array of micro and nano zinc oxide wire.

12. The method for fabricating an organic-inorganic lighting device according to claim 11, wherein said insulation layer is firstly formed over said array of micro and nano zinc oxide wire and said seed layer, and then said insulation layer is etched to have a thickness which is less than or equal to length of wires of said array of micro and nano zinc oxide wire, and then said first electrode layer is formed over said array of micro and nano zinc oxide wire and said seed layer.

13. The method for fabricating an organic-inorganic lighting device according to claim 8, wherein said seed layer is formed using spin-coating method, dip-coating method, evaporation method, sputtering method, atomic deposition method, electrochemical deposition method, pulsed laser deposition method, or metalorganic chemical vapor deposition method.

14. The method for fabricating an organic-inorganic lighting device according to claim 8, wherein said seed layer comprises zinc oxide, gold, tin, or cobalt.

15. The method for fabricating an organic-inorganic lighting device according to claim 14, wherein when said seed layer is made of gold, tin, or cobalt, said seed layer is fabricated by applying micro and nano particles of gold, tin, or cobalt onto said organic conductive thin-film layer with an evaporation method or a sputtering method.

16. The method for fabricating an organic-inorganic lighting device according to claim 14, wherein when said seed layer is made of zinc oxide, gold, tin, or cobalt, said seed layer is fabricated by applying micro and nano particles of gold, tin, cobalt, or zinc oxide onto said organic conductive thin-film layer with a spin-coating method or a dip-coating method.

17. The method for fabricating an organic-inorganic lighting device according to claim 16, wherein said spin-coating method or said dip-coating method requires a solution of isopropanol, methanol, ethyl alcohol, glycerol, or propanol.

18. The method for fabricating an organic-inorganic lighting device according to claim 8, wherein said array of micro and nano zinc oxide wire is formed by hydrothermal method, thermal evaporation method, chemical vapor deposition method, molecular beam epitaxy method, anodic aluminum oxide (AAO) method, or electrochemical method.

19. The method for fabricating an organic-inorganic lighting device according to claim 8, wherein said organic conductive thin-film layer is formed by spin-coating method, dip-coating method, or ink printing method.

20. The method for fabricating an organic-inorganic lighting device according to claim 19, wherein said spin coating method, said dip coating method or said ink printing method requires chloroform, dichloromethane, toluene, tetrahydrofuran, 1,2-dichlorobenzene, 1,4-dichlorobenzene, chlorobenzene, or n-hexane.

* * * * *